June 25, 1963 J. H. McCALLUM 3,095,146
CONTINUOUS COUNTER
Filed Aug. 2, 1961

INVENTOR.
JOHN H. McCALLUM
BY Moody & Anderson
AGENTS

United States Patent Office 3,095,146

Patented June 25, 1963

3,095,146
CONTINUOUS COUNTER

John H. McCallum, Marion, Iowa, assignor to Collins Radio Company, Cedar Rapids, Iowa, a corporation of Iowa Filed Aug. 2, 1961, Ser. No. 128,852
4 Claims. (Cl. 235—117)

Figure 1:
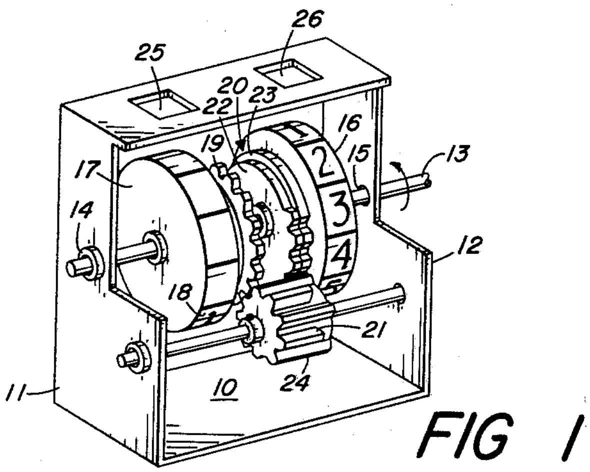

This invention relates generally to counting mechanisms and more particularly to a counter mechanism capable of counting continuously from unity through a predetermined multiple of the digit 10.

Digital counting mechanisms are widely employed to indicate shaft position in various mechanisms and are used extensively in the radio field wherein the relative position of a tuning shaft, for example, is applied as a rotational input to a counter, which digitally displays shaft position which might be interpreted in terms of a particular channel to which the radio is being tuned. Known digital counters employ Geneva-like transfer mechanisms to advance the ten's digit wheel one digit upon the completion of a full revolution of the unit's digit wheel. Counters of this type are widely employed as odometers and count from "0-0" through "99" and hence back to "0-0" in a continuous sense. Counter mechanisms of this type function in a decade fashion; that is, for each revolution of the unit's digit wheel, the ten's digit wheel is advanced one-tenth revolution with the arrangements being cascaded as desired with additional wheels to display one-hundred's and one-thousand's digits.

When the conventional decade counter is employed in a mechanical arrangement wherein a lesser number of indications than the counter's full capability is desired, the counter is not "continuous" for the application and a mechanical means must be employed to prevent the counter (and thus the tuning motion in any given direction) from exceeding the rotational limits which define the lowest and highest digits to be displayed. In radio tuning apparatus the employment of the conventional two-digit counter to display, for example, twenty incremental shaft positions, necessitates mechanical stops in the tuning arrangement whereby the tuning shaft must be limited to clockwise and counter-clockwise extremes. As is often times the case, a predetermined number of incremental shaft positions are utilized to position a rotary switch for tuning purposes and the incorporation of a conventional counter has two readily apparent disadvantages. Firstly, the tuning motion cannot be continuous in the sense that the tuning motion may be sequentially and repetitively accomplished by tuning shaft rotation in one direction. Secondly, to fully utilize the complete number of positions in a rotary switch, the necessary mechanical stops must include provision for "lost motion" in order to utilize all possible switch positions. With the imposed limitation of end stops, the tuning motions must be accomplished between rotational extremes, and in the situation of tuning from the highest position to the lowest, the mechanism must be "backed down." A continuous counter, on the other hand may be employed in a tuning mechanism and enable unidirectional or bi-directional shaft rotation while maintaining the displayed count corresponding to each tuning shaft position. A continuous counter enables correct display of the count while imposing no rotational limits between which tuning must be accomplished. The tuning operation may then be affected by a shaft rotation in the direction which is the "shortest way around." The enablement of a continuous tuning arrangement results in obvious advantages in terms of time saved and minimizing the mechanical motion required for retuning. In those applications wherein the tuning shaft would be automatically and remotely controlled, the use of a continuous counter permits a far less complex control circuitry and a more efficient tuning operation.

It is an object, therefore, of the present invention to provide a method of and means for obtaining a continuous digital count to any predetermined multiple of ten.

The present invention is featured in the provision of a novel transfer mechanism between successive counter digit wheels whereby a count from unity through a predetermined and selected multiple of ten may be realized in a continuous fashion.

Figure 2:
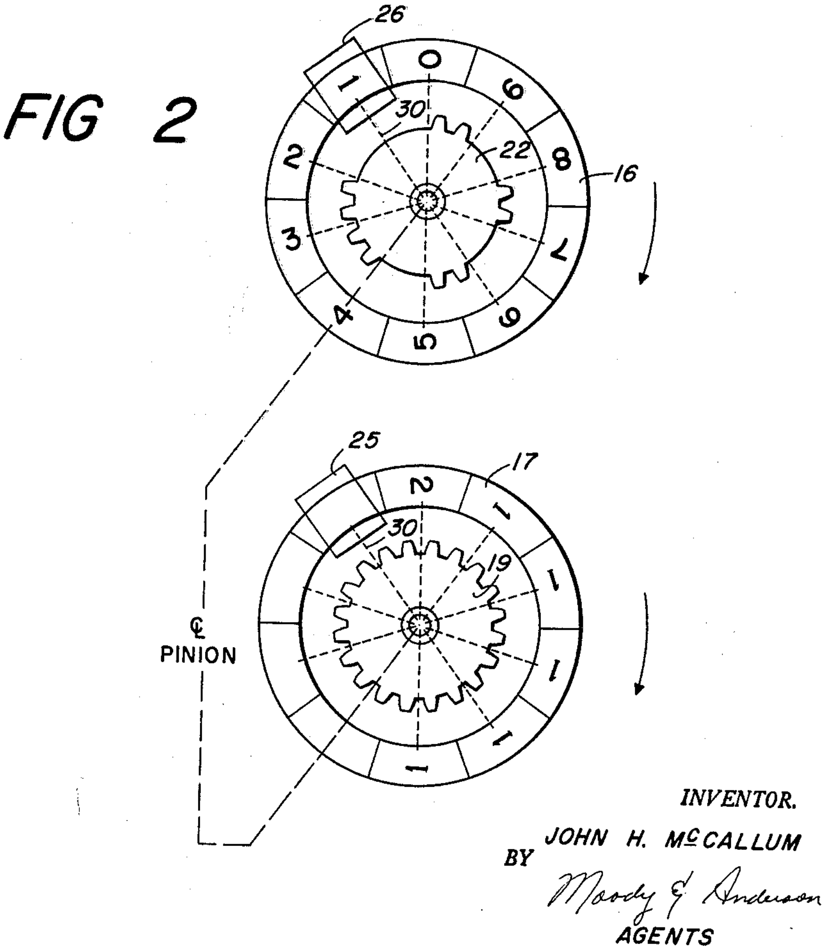

These and other features and objects of the present invention will be apparent from reading the following description in conjunction with the accompanying drawings in which:

FIGURE 1 is an isometric view of an employment of the invention and FIGURE 2 is a diagrammatic illustration of the digit-indicating wheels of the device of FIGURE 1 showing the relative arrangement of digit display fields and transfer mechanism gearing.

With reference to FIGURE 1, a counter mechanism constructed in accordance with the present invention is seen to comprise a housing member 10 including end mounting plates 11 and 12 through which a shaft 13 is rotatably received in end bearings 14 and 15. A first digit indicating wheel 16 is affixed to shaft 13 and provided with digits 0 through 9, which are extended symmetrically about the circumference thereof. Wheel 16 serves as the unit's digit indicator and rotates with input shaft 13 in a continuous fashion as with conventional decade counters. A second digit indicating wheel 17 is rotatably mounted with respect to shaft 13 and is provided with a plurality of digit indicating fields about its periphery. Viewing windows 25 and 26 are provided in the housing member 10 through which the observer views predetermined ones of the digit fields on the indicating wheels 17 and 16.

Each of the wheels 16 and 17 is provided with a gear member which is affixed to the wheel. A driven gear 19 is affixed to wheel 17 and is likewise mounted for rotation about the axis of the shaft 13. Motion from the unit's wheel 16 is imparted through a mutilated drive gear 20 affixed thereto and a transfer pinion 21 which engages gears 19 and 20. Gear 20 is comprised of first and second plate members 22 and 23; the plate 22 being formed with a predetermined plurality of gear teeth and plate 23 being formed with peripheral clearance notches to coincide with the tooth spaces on plate member 22. Transfer pinion 21 includes a plurality of longitudinally extended teeth 24 which engage those of gear 19 and gear 20 with alternate ones of the teeth 24 being extended to provide an anti-rotation lock against the outside diameter of plate 23 of gear member 20.

The construction of the gear member 20 and the manner in which gear 20 meshes with transfer pinion 21 is that of a conventional two-tooth advance transfer mechanism to affect predetermined advances of the ten's digit wheel 17 while maintaining a rotational lock to wheel 17 between the advance motions. The present invention resides in the manner of affecting a predetermined repetitive advance sequence of wheel 17 for each revolution of the unit's wheel 16, together with a manner of applying a sequence of digital representations 18 (including blank representations) about the circumference of the ten's wheel 17.

The invention may best first be considered in terms of general operational principles. As above discussed, the conventional decade counter affects one incremental advance of the ten's digit wheel for each complete revolution of the unit's wheel. Thus, a two-digit counter would count continuously from "00" to "99" and hence to "00", etc. Assuming then that a count from one unit through twenty is to be utilized, a conventional counter could be employed with the limitation of stop mechanisms to confine the rotational input between clockwise and counterclockwise extremes such that the counter might display only the first twenty numbers. This counter could not be adapted for continuous display, however, since a further rotational input beyond the count of twenty would display a count of "twenty-one" rather than "one", as desired. The present invention functions advantageously to display the numbers one through twenty in a continuous fashion, such that the highest desired count is sequentially followed by a repetition of the count from unity.

FIGURE 1 illustrates, in accordance with the present invention, a counter capable of continuous digital display from one through twenty. Since a count to twenty involves two complete revolutions of the unit's digit wheel 16, the ten's digit wheel 17 must complete a single revolution in this time. More precisely, the ten's digit wheel 17 must be advanced $\frac{1}{10}$ revolution for a total of ten advances during the completion of two full revolutions of the unit's digit wheel 16. It is to be noted that for a continuous count of twenty, the ten's digit "2" must appear in the viewing window 25, but once during the complete count sequence. It follows then that the unit's wheel must make as many revolutions as the number of ten's digits to be presented, and in case of count of twenty, the only ten's digits used are one and two, with the two appearing only once for the number twenty. Therefore there must be a transfer or advance of the ten's digit wheel immediately preceding and following the appearance of ten's digit two in window 25. Because a ten's digit one must appear with unit's digit zero for the number ten, the same double transfer must occur at number ten as at number twenty. The unique feature of this invention which enables it to function properly is the relationship of the peculiar sequence of teeth and spaces on gear 22 to the sequence of blank spaces and digits on the ten's digit wheel. Generally, then, the transfer mechanism must affect a particular sequence of ten's wheel advances for each revolution of the input shaft and this sequence is to be repeated *n* times, where *n* is the highest ten's digit to be displayed.

For the twenty-position counter illustrated in the figures, the gear 20 may be comprised of a twenty-tooth gear from which ten teeth have been removed. The remaining teeth are arranged in five pairs, each pair of which, upon engaging transfer pinion 21, advances the ten's digit wheel drive gear 19 by two teeth. Thus, a sequence of five advances of ten's wheel 17 is affected for each revolution of unit's wheel 16. The ten's wheel drive gear 19 is provided with a number of teeth equal to the count to be displayed and in the case of the twenty count mechanism illustrated, the ten's wheel 17 may uniquely be provided with ten symmetrically disposed digit fields. Thus the ten's wheel 17 advances five one-tenth-revolution segments for each revolution of the unit's wheel with the advance sequences being symmetrically disposed such that the desired ten's digit may be viewed in window 25.

FIGURE 2 illustrates diagrammatically the driving arrangement for the twenty position continuous counter of FIGURE 1. The windows 25 and 26 are shown deposed over particular fields on the units and ten's digit wheels with the counter displaying the count of unity. Since a transfer motion is imperative before and after the highest ten's digit to be counted and symmetry is necessary, a total of four transfers is required for this limitation. Since ten transfers of the ten's wheel must be accomplished, the remaining six transfers are affected with particular pairs of teeth on the unit's gear 20 with a pattern of repeated digital representations on the ten's wheel 17, as necessary.

With reference to FIGURE 2 the unit's wheel 16 and ten's wheel 17 are illustrated in combination with their respective drive and driven gears and their digit indications with respect to the gear arrangement and viewing windows. The viewing windows 25 and 26 are indicated on a center line 30 which is located 108 degrees from the transfer pinion center line. Each of the wheels in FIGURE 2 is illustrated considering a clockwise rotation for an increasing count from the count of unity which is illustrated. Since five advances will be imparted to the ten's wheel for each of the two revolutions of the unit's wheel to complete the count, the ten's wheel is advanced immediately preceding and following the digit 2 so that the digit 2 appears but once in the viewing window 25 and the remaining digit fields about the periphery of ten's wheel 17 are comprised of blank fields and those carrying the digit 1. Rotation of input shaft 13 and the unit's wheel 16 is thereby continuous for a viewed unit's digit sequence of one through zero while the ten's wheel motion is intermittent and completes one complete revolution to two of the units wheel. As the input is imparted to shaft 13 of the ten's wheel shows a blank field for units digits 1 and 2; moves to a second blank field for the unit's digit 3 and 4; moves to a third blank field for unit's digits 5 and 6; moves to a fourth blank field for unit's digits 7, 8 and 9; moves to a digit one field for unit's digit zero; moves to a second digit one field for unit's digits 1 and 2, a third digit one field for unit's digits 3 and 4, a fourth digit one field for units 5 and 6; a fifth digit one field for units 7, 8 and 9 and moves to the single digit two field for unit's digit zero for a completion of one full count of twenty. Continued rotation of input shaft moves the ten's digit wheel such that the first blank field is viewed in the window as the unit's wheel presents the digit one in window 26 as a repetition of the count.

It is seen that a repetitive intermediate transfer sequence is involved between the continuously rotating unit's wheel 16 and the intermittently advanced ten's wheel 17. Five advances in a predetermined sequence are imparted for each revolution of the unit's wheel due to the five pairs of teeth on the unit's drive gear 20. Continuity of the displayed count with unidirectional input is realized since a predetermined advance sequence is imparted to the ten's wheel 17 for each revolution of the unit wheel and each advance is a predetermined angular increment such that the repeat of the advance sequence for *n* revolutions of the unit's wheel inputs a full 360 degree rotation to the ten's wheel during the complete count, thus readying the mechanism for a repeat count.

The twenty position counter illustrated and above described is a special case of a general approach in accordance with this invention wherein the ten's wheel may have ten fields thereon similar to the unit's wheel. In a general sense, by employing five pairs of teeth in the unit's drive gear 20, as formed from utilization of a twenty tooth gear geometry, the number of fields on the ten's wheel is equal to one-half of the count to be displayed. In the case of a continuous count of 30, gear 19 would be formed with thirty teeth and fifteen fields would be placed symmetrically about the ten's wheel 17. Each revolution of the unit's wheel would then complete one-third of the total advances imparted to the ten's wheel and for the three unit's wheel revolutions necessary in a count of thirty, the ten's wheel would complete three sequences of five advances each, for a total of fifteen advances and thus complete a full 360 degrees of travel and be ready for a repeat of the sequence. The arrangement of the five pairs of teeth on the units drive gear 20 is preselected for a particular count so as to impart an advance immediately prior to and following the appearance of the highest ten's digit in window 25 and likewise before and after each lower order ten digit to be viewed. An advance preceding and following each ten's digit to be viewed results in three intervening distributed advances to the ten's wheel per sequence. This arrangement provides for $n$ symmetrical and repetitive sequences for any desired count to a multiple of ten. As a further example, considering a count to forty; the ten's wheel gear 19 would be provided with forty teeth and the ten's wheel 17 provided with twenty uniformly distributed fields, such that during the four revolutions of the unit's dial a sequence of five advances is repeated four times to complete a full revolution of the ten's wheel and ready the counter for a repeat of the count.

It is to be realized that the twenty position counter illustrated, uniquely requires ten fields on the ten's wheel and enables a similar viewing window arrangement with ten's digit representations similar in size to those of the unit's wheel. When, in accordance with this invention the ten's wheel is imparted with other than ten advance sequences for a complete count, two alternatives must be considered as concerns the viewing arrangement. Firstly, the wheels may be of similar diameter and the digital representations on the unit's wheel be made of a similar size to conform with the maximum size which may be placed about the ten's wheel, with the viewing windows made correspondingly smaller if desired or a magnification incorporated in the viewer. A further alternative is the employment of a ten's wheel of a correspondingly large diameter such that each of its necessarily greater number of viewing fields may correspond in size to those on the unit's wheel.

The present invention is thus seen to provide a continuous counter capable of counting to a multiple of ten with a minimum of mechanical complexity. Masking arrangements are obviated, since the desired continuous count is effected solely by a system of repetitive advance sequences with the omission or repetition of ten's digit representations on the ten's wheel as the case may dictate. Each of the repetitive advance sequences for a particular count to a multiple of ten incorporates an advance of the ten's wheel immediately preceding and following the highest ten's digit with a remaining three advances being imparted arbitrarily during the course of each revolution of the unit's wheel.

Although this invention has been described with respect to a particular embodiment thereof, it is not to be so limited as changes might be made therein without departing from the inventive principles as outlined in the appended claims.

I claim:

1. A counter mechanism including first and second digit display wheels in conjunction with a viewing means by which a predetermined digit display field on each of said wheels is observed, said counter providing in response to a rotational input to said first wheel a continuous display of each digit from unity through $10n$, where $n$ is an integer; a transfer mechanism communicating with each of said digit display wheels for effecting a predetermined number of incremental rotational advances of said second wheel in response to each complete revolution of said first wheel, said incremental advances including one such advance immediately preceding and one immediately following the observed position of each ten's digit to be displayed and further including a remaining number of said advances being affected during each revolution of said first digit wheel; said second digit wheel including a plurality of $nx$ fields displaced symmetrically about the periphery thereof where $n$ is the highest ten's digit to be displayed and $x$ is the number of advances imparted to said second wheel for each revolution of said first wheel, whereby $n$ revolutions of said first wheel affects a plurality of $nx$ incremental advances of said second wheel, said first digit wheel comprising symmetrically disposed digits fields about the periphery thereof carrying the units digits one through zero respectively, said plurality of $nx$ fields about the periphery of said second digit wheel including a predetermined one carrying the ten's digit $n$ and predetermined others carrying those ten's digits of lower order than the digit $n$.

2. A counter mechanism for digitally displaying each digit from unity to $10n$, where $n$ is an integer and the highest ten's digit to be displayed; comprising first and second digit wheels, said first digit wheel including ten uniform and symmetrically placed digit fields about the periphery thereof with said fields consecutively displaying the units digits one th rough zero, said second digit wheel having symmetrically displaced about the periphery thereof a plurality of $10n/2$ digit display fields and including one such field carrying the digit $n$ with predetermined ones of the remaining fields thereon carrying the ten's digits of lower order than the digit $n$, a rotational input imparted to said first wheel, transfer means intermediate said first and second wheels adapted for effecting a predetermined number of intermediate angular transfer motions between said first wheel and said second wheel, said number of transfers during $n$ revolutions of said first wheel being equal to $10n/2$, said transfer motions including one immediately preceding and following each complete revolution of said first wheel and a remaining plurality of $3n$ transfers intermediately effected between complete revolutions of said first wheel.

3. A counter mechanism including first and second digit wheels for displaying continuous each digit from unity through $10n$, where $n$ is an integer and the highest ten's digit to be displayed; comprising a first gear means rotatable with said first digit wheel, said first gear means including a plurality of five pairs of teeth circumferentially displaced about the periphery thereof, a second gear means affixed for rotation with said second digit wheel and including a plurality of $10n$ symmetrically disposed teeth about the periphery thereof, pinion transfer means engaging each of said first and second gear means, each of said pairs of teeth on said first gear means affecting through said pinion transfer means, an advance of two teeth on said second gear means said first wheel having peripherally disposed thereabout a plurality of ten symmetrical fields carrying consecutively the digits zero through nine, respectively, said second wheel having peripherally disposed thereabout a plurality of $10n/2$ fields, selected ones of which carry one of the digits of lower order than the digit $n$ and one of which carries the digit $n$, means for displaying a predetermined one of the fields on each of said wheels, said first gear means imparting through said transfer pinion a plurality of five transfer motions to said second gear means for each revolution of said first gear means including one such transfer motion immediately preceding and one immediately following the display of the field carrying the digit $n$ on said second wheel and three remaining transfers affected arbitrarily throughout the remaining portion of each revolution of said first gear means, certain of said digits of lower order than the digit $n$ being repetitively carried by the fields on said second wheel, whereby during $n$ revolutions of said first wheel a plurality of $n$ sequences of five transfer motions each is imparted to said second wheel to impart a complete revolution thereto.

4. A counter mechanism for continuous digital display in conjunction with a viewing means through which predetermined ones of peripherally disposed digit carrying fields on each of two digit wheels may be observed, said digit wheels including a unit's digit wheel carrying digits zero through nine sequentially and a ten's digit wheel, a driven gear affixed for rotation with said unit's digit wheel and including twenty teeth about the periphery thereof, a drive gear of like diameter affixed for rotation with said unit's digit wheel and having a plurality of five pairs of teeth disposed about the periphery thereof, an idler transfer pinion engaging said drive and driven gears, means for imparting a rotational input to said drive gear, each of said pairs of teeth on said drive gear in response to said rotational input and upon engagement with said transfer pinion imparting a one-tenth revolution transfer motion to said ten's digit wheel, said transfer motions including one preceding and one following each complete revolution of said drive gear with a plurality of three transfer motions being imparted intermediate each complete revolution of said drive gear, the digit carrying fields on said ten's digit wheel including predetermined ones carrying the digit "1," a single field carrying the digit "2," with the remaining digit carrying fields thereon being blank.

References Cited in the file of this patent

FOREIGN PATENTS 741,772 Great Britain ---------- Dec. 14, 1955